United States Patent [19]

Kuo

[11] Patent Number: 4,827,448

[45] Date of Patent: * May 2, 1989

[54] RANDOM ACCESS MEMORY CELL WITH IMPLANTED CAPACITOR REGION

[75] Inventor: Chang-Kiang Kuo, Houston, Tex.

[73] Assignee: Texas Instruments Incorporated, Dallas, Tex.

[*] Notice: The portion of the term of this patent subsequent to Dec. 16, 1997 has been disclaimed.

[21] Appl. No.: 210,164

[22] Filed: Jun. 21, 1988

Related U.S. Application Data

[60] Continuation of Ser. No. 552,637, Nov. 6, 1984, which is a continuation of Ser. No. 199,417, Oct. 22, 1980, abandoned, which is a division of Ser. No. 722,841, Sep. 13, 1976, Pat. No. 4,240,092.

[51] Int. Cl.$^4$ .................. G11C 11/24; G11C 11/34; H01L 29/78; H01L 27/02
[52] U.S. Cl. .................. 365/149; 365/182; 365/184; 357/236; 357/41; 357/51; 357/91
[58] Field of Search .................. 365/149, 182, 184; 357/41, 23.6, 23.5, 51, 91

[56] References Cited

U.S. PATENT DOCUMENTS

| | | | |
|---|---|---|---|
| 3,811,076 | 5/1974 | Smith, Jr. | 357/23.6 |
| 3,834,959 | 6/1972 | Dennard et al. | 357/23.6 |
| 4,012,757 | 3/1977 | Koo | 357/23.6 |
| 4,240,092 | 12/1980 | Kuo | 365/149 |
| 4,319,342 | 3/1982 | Scheuerlein | 365/72 |
| 4,371,955 | 2/1983 | Sasaki | 365/184 |
| 4,502,208 | 3/1985 | McPherson | 365/182 |
| 4,574,465 | 3/1986 | Rao | 365/149 |
| 4,592,022 | 5/1986 | Shimohigashi et al. | 365/189 |

Primary Examiner—Terrell W. Fears
Assistant Examiner—Melissa J. Koval
Attorney, Agent, or Firm—John D. Kling; Thomas W. DeMond; Melvin Sharp

[57] ABSTRACT

An N-channel MOS random access memory of the one transistor type is disclosed. The cell utilizes an ion implanted area beneath the capacitor dielectric to permit lower bias voltages on the capacitor. In one example, two levels of polycrystalline silicon are used, one for the bias voltage side of the storage capacitor, and the other for the gate of the MOS transistor and to connect the gate to the bit select line. The capacitor dielectric may be formed of thermal silicon oxide which is about half as thick as the gate insulator of the MOS transistor in the cell. In another example, a single-level poly cell uses an implanted region for the same purpose; the capacitor dielectric is the same thickness as the MOS gate insulator so the lower bias voltage functions to reduce stress failures of the dielectric.

51 Claims, 5 Drawing Sheets

RANDOM ACCESS MEMORY CELL WITH IMPLANTED CAPACITOR REGION

This application is a continuation of application Ser. No. 552,637, filed Nov. 6, 1984, which is a continuation of application Ser. No. 199,417, filed Oct. 22, 1980, now abandoned, which was a divisional of application Ser. No. 722,841, filed Sept. 13, 1976 (now U.S. Pat. No. 4,240,092).

BACKGROUND OF THE INVENTION

This invention relates to semiconductor memory devices and methods of manufacture thereof, and more particularly to an N-channel silicon gate MOS RAM cell.

Semiconductor memory cells of the one-transistor type are used in N-channel silicon gate MOS RAM's as described in U.S. Pat. No. 3,909,631, issued Sept. 30, 1975 to N. Kitagawa, and assigned to Texas Instruments Incorporated, and described in *Electronics,* Sept. 13, 1973, p. 116. The most widely manufactured device of this type contains 4096 or $2^{12}$ bits, referred to in the industry as a "4K RAM". The costs in the production of semiconductor devices are such that most of the expense is in bonding, packaging, testing, handling, and the like, rather than the cost of the small chip of silicon which contains the actual circuitry. Thus, any circuit which can be contained within a chip of a given size, for example, 30,000 square mils, will cost about the same as any other. By forming "16K" or 16384 ($2^{14}$) memory cells or bits in a chip, large economies in the cost per bit can result if reasonable yields are obtained. As the size of a chip increases, the yield decreases, so that at sizes above about 180 mils on a side the advantages are outweighed by reduction in yield. Accordingly, it is desireable to reduce the area occupied by each bit or cell in a RAM.

One type of N-channel MOS one-transistor memory cell employing double-level polycrystalline silicon is described in my copending patent application Ser. No. 648,594, filed Jan 12, 1976, now abandoned, assigned to Texas InstrumentS. The present invention is an improvement on the cell of my previous application.

One-transistor cells in MOS integrated circuits employ storage capacitors of the type having a silicon oxide dielectric as set forth in U.S. Pat. No. 3,350,760, issued Nov. 7, 1967, to Jack s. Kilby, assigned to Texas Instruments. These may be of the so-called gated type, i.e. voltage dependent, and may have ion implanted regions thereunder as set forth in copending application Ser. No. 645,171 filed Dec. 29, 1975 (now abandoned) and Ser. No. 828,359, a continuation of Ser. No. 645,171. filed Aug. 29, 1977 (now U.S. Pat. No. 4,249,194) by Gerald D. Rogers, assigned to Texas Instruments Incorporated.

In a dynamic RAM using one-transistor cells, the reliability of the storage capacitor is most critical, since the capacitors constitute a major portion of the total thin oxide area of the chip. Generally, reliability and yield of a device are both inversely related to the area of the chip occupied by their oxide. The capacitor dielectric areas are more critical than the gate areas of the transistors because they are larger and are under a high potential stress at all times. Life test data on N-channel MOS dynamic RAM devices shows that 80 to 90% of reliability related failures are due to oxide defects in the storage capacitors. If the electric field intensity in the storage capacitor dielectric can be reduced, the reliability can be increased. Reliability of a thin silicon oxide dielectric in a capacitor is highly dependent on the electric field intensity in the oxide. Alternatively, by reducing the field intensity, the oxide can be made thinner so that the capacitance per unit area may be increased, allowing a reduction in all area thin oxide area.

The principal object of this invention is to provide an improved random access memory cell of higher reliability, smaller size, and/or higher yield. Another object is to provide an improved method of making N-channel silicon gate RAM devices.

SUMMARY OF THE INVENTION

According to one embodiment of the invention, an improved storage capacitor for an N-channel silicon gate MOS memory cell is provided which uses two levels of polycrystalline silicon. The first level provides the upper plate of the storage capacitors for the cells in a column, and beneath this plate is an ion implanted region which functions to lower the voltage needed to invert this area. This first level is connected to a bias voltage supply which is of lower value than previously used thus lowering the electric field intensity in the capacitor dielectric. The second level polycrystalline silicon provides the gates of the MOS transistors, and also the connection from the gates to an overlying metal strip which is the X address line. The contact area between the metal strip and the second level poly may overlie a part of the first level poly. The implanted area extends beyond the edge of the first level poly, toward the MOS transistor, to assure a low impedance path. In this embodiment, the silicon oxide which forms the capacitor dielectric may be thinner than that which forms the gate insulator of the transistor, so the capacitance is increased.

In another embodiment, a single level poly provides both the transistor gate and the top plate of the capacitor; here the implanted region functions to lower the electric field intensity in the capacitor dielectric and this increases reliability.

THE DRAWINGS

The novel features believed characteristic of the invention are set forth in the appended claims. The invention itself, however, as well as other features and advantages thereof, is best understood from the following detailed description of particular embodiments, when read in conjunction with the accompanying drawings, wherein:

Figure 1:
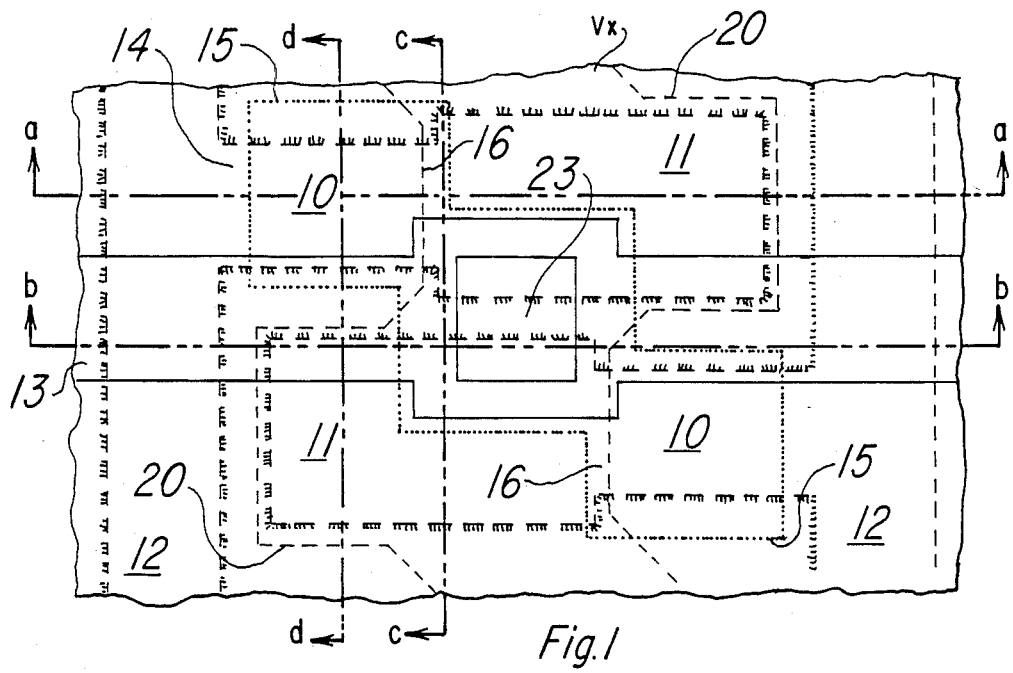
FIG. 1 is a greatly enlarged plan view of a very small area on a semiconductor chip, showing two random access memory cells made according to the invention.
Figure 3A:
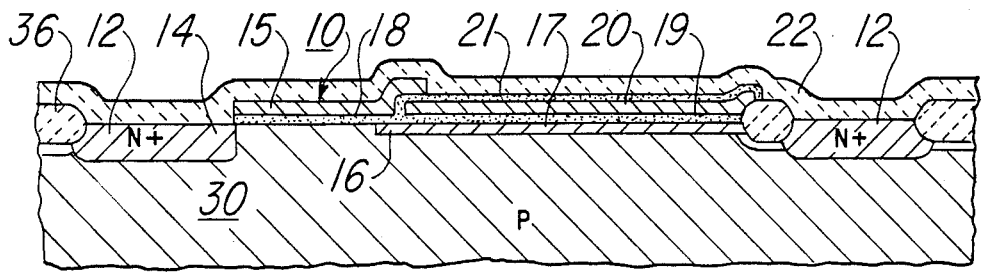

FIGS. 3*a,* 3*b,* 3*c* and 3*d* are sectional views of the device of FIG. 1, taken along the lines a-a, b-b, c-c and d-d of FIG. 1, respectively.

FIGS. 4*a* through 9 of my U.S. Pat. No. 4,240,092 are incorporated herein by reference.

DETAILED DESCRIPTION OF SPECIFIC EMBODIMENT

Figure 2:
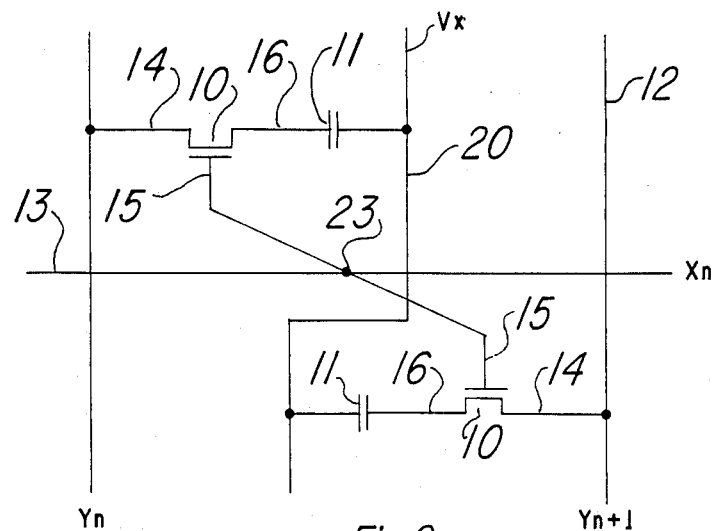
FIG. 2 is an electrical schematic diagram of the cells of FIG. 1.

Referring to FIG. 1, MOS RAM cells according to the invention are illustrated in physical layout. Each cell includes an MOS access transistor 10 and a storage capacitor 11, as also seem in the electrical schematic diagram of FIG. 2. Sense lines 12 are provided by N+ diffused regions; these lines are the Y lines which connect to a large number of the cells in a column. For example, there may be one hundred twenty-eight cells in a column, each having a transistor 10 and a capacitor 11 connected to a sense line 12. A sense amplifier of the type shown in U.S. patent Aaplication Ser. No. 691,734, filed June 1, 1976 by White and Kitagawa, now abandoned, or U.S. Pat. No. 4,071,801, both assigned to Texas Instruments, would be included at the center of each column or sense line. A metal strip is the X address or row select line 13, and this line is connected to all the gates of all transistors in a row, for example one hundred twenty-eight in a 16K RAM. The area occupied by the two cells of FIG. 1 is now more than about one mil squared, or one-half square mil per cell.

Figure 3B:
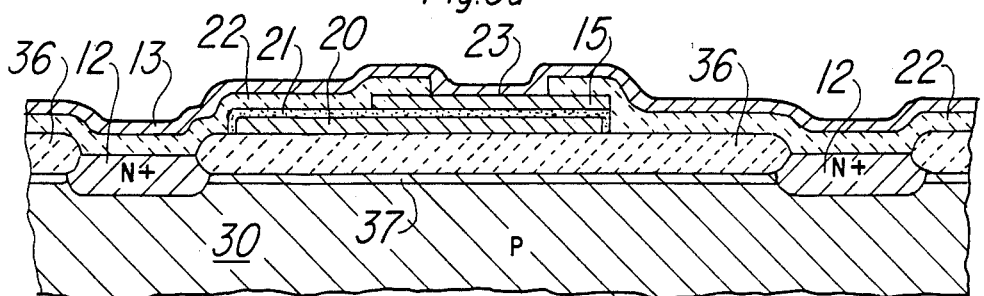
Figure 3C:
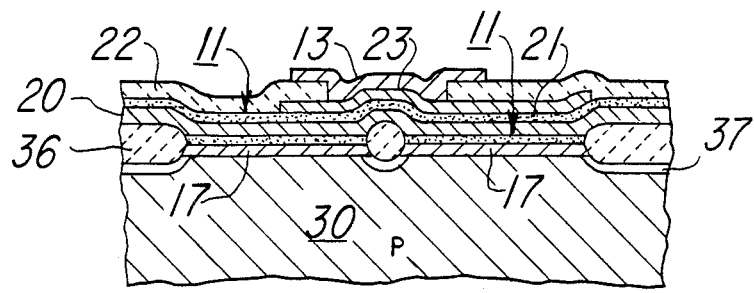
Figure 3D:
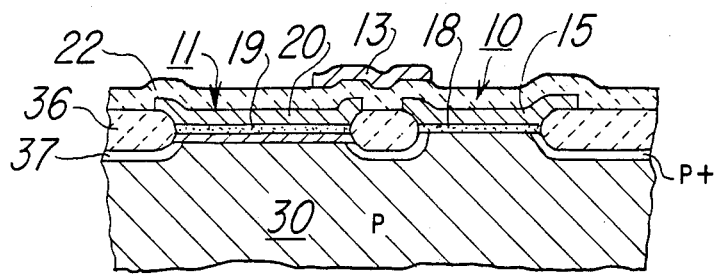

As best seen in FIGS. 3a–3d, along with FIG. 1, each MOS transistor 10 includes an N+ diffused region 14 which forms the source (or drain). The N+ region 14 is part of the sense line 12 which is an elongated continuous diffused N+ region. Further, the transistor 10 includes a gate 15 created by the second-level polycrystalline silicon, as will be explained. The drain 16 of the MOS transistor is is created by the edge of an implanted inversion region 17 beneath the capacitor 11. The implanted region 17 provides a primary feature of the invention in that the voltage needed to invert this region is much less than previously required. A thin silicon oxide layer 18 functions as the gate insulator for the MOS transistor 10, and a separate thin oxide layer 19 provides the dielectric of the capacitor 11. According to one feature of the invention, the oxide layers 18 and 19 may be of different thicknesses. The upper plate for the capacitor 11 is provided by the first-level polycrystalline silicon which is an elongated strip 20 connected to a supply voltage Vc which may be about one-half Vdd, according to one aspect of the invention. It is important that the implant region 17 extends beyond the edge of the first level poly 20 to avoid a high resistance gap at the location 16; this will be understood when the method for making is explained. A layer 21 of silicon oxide separates the first and second levels of polysilicon 20 and 15, and a thick layer 22 of silicon oxide covers both layers of polysilicon as well as the entire chip. As seen in FIG. 3b, a metal strip which forms the row address line 13 overlies the layer 22 and extends down to make contact with the second level poly 5 at a contact location 23.

Figure 4A:
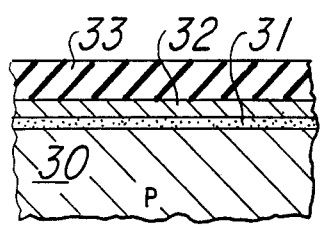
Figure 4B:
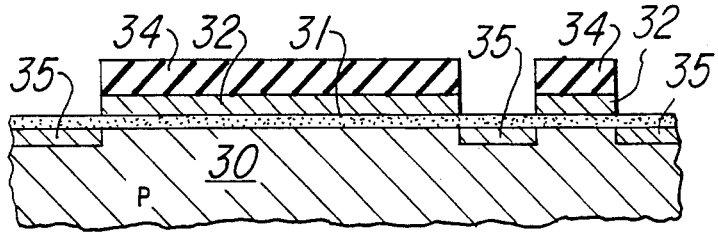
Figure 4C:
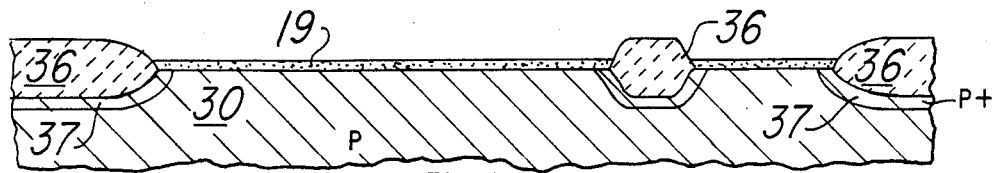
Figure 4D:
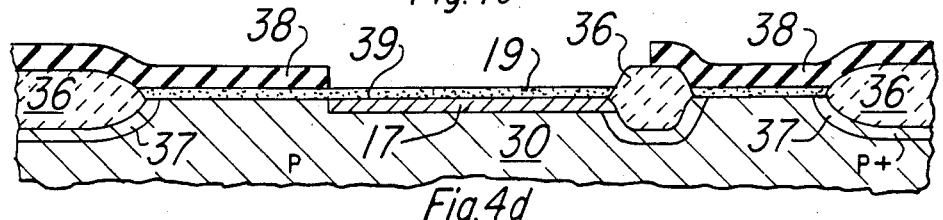
Figure 4E:
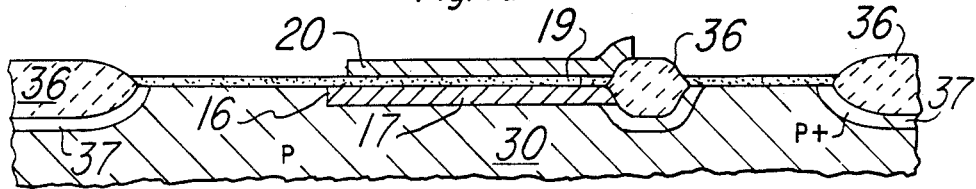
Figure 4F:
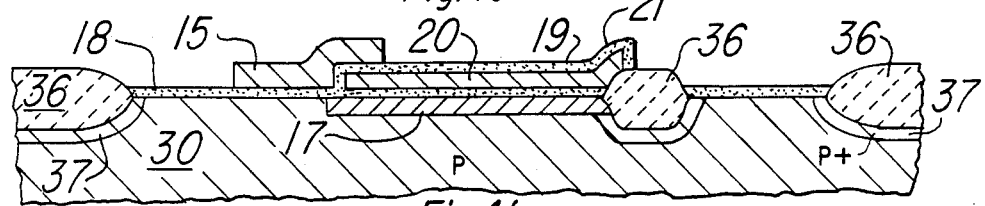
Figure 4G:
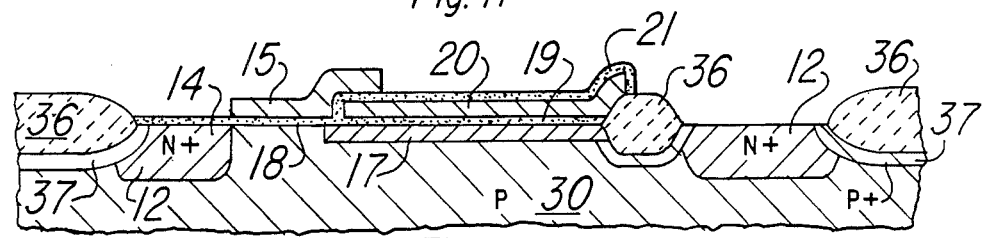

A method of making the cell of FIG. 1 is described with reference to FIGS. 4a–4b of my U.S. Pat. No. 4,240,092 which is incorporated herein by reference.

Figure 5:
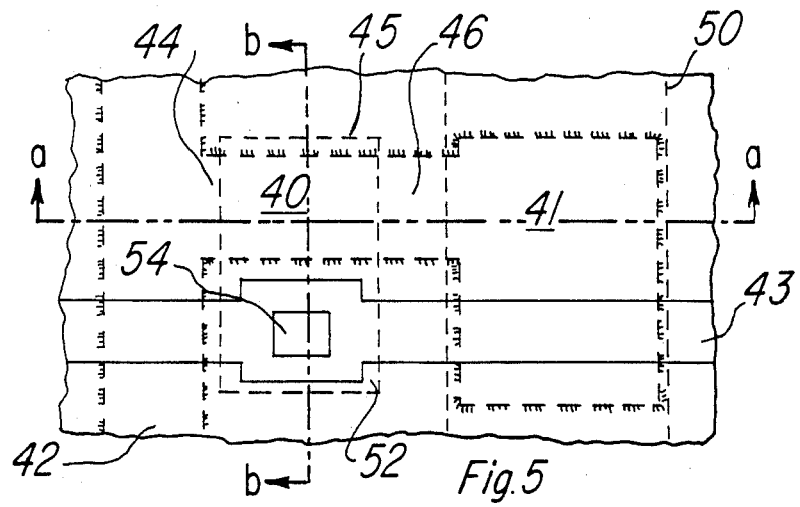
Figure 6A:
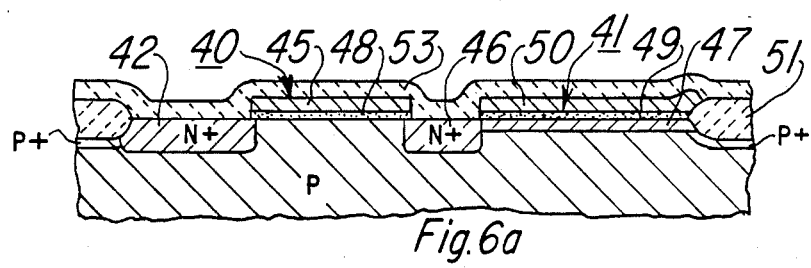
Figure 6B:
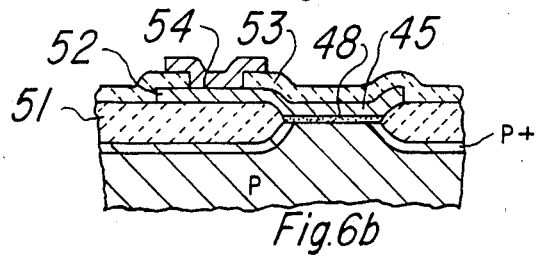
Figure 7:
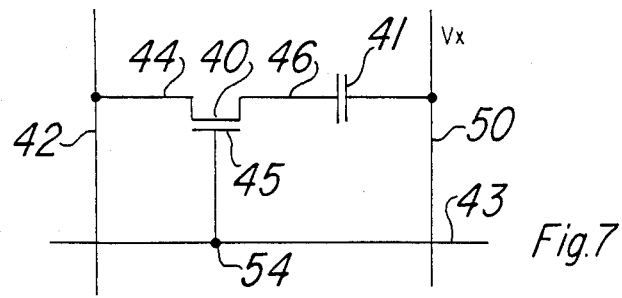
Figure 8A:
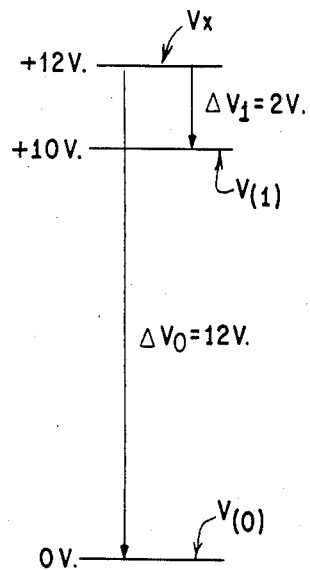
Figure 8B:
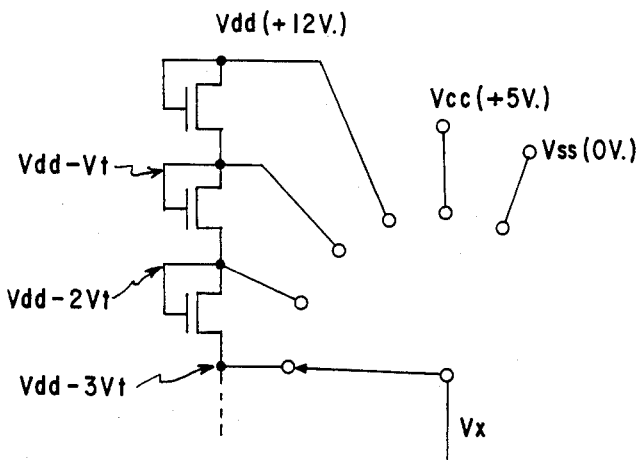
Figure 8B:
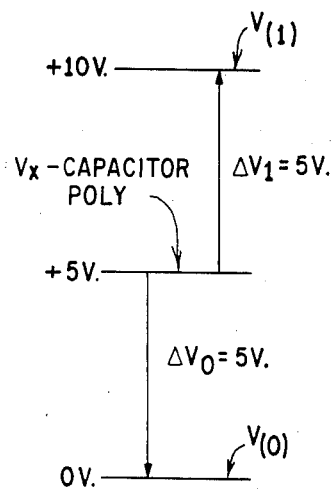

Referring now to FIG. 5 of my U.S. Pat. No. 4,240,092, incorporated herein by reference, an embodiment of the invention is shown using single level polysilicon in a RAM cell.

Figure 9:
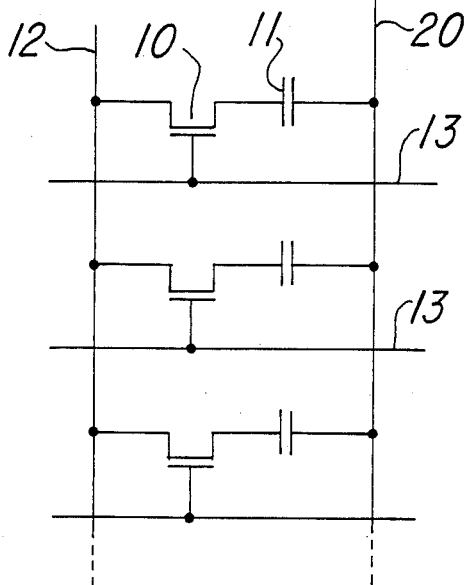

In many dynamic RAM applications, it is desirable that Vcc supply be turned off during low power standby mode operation. To meet this requirement the Vx voltage can be generated from Vdd with an MOS circuit as seen in FIG. 9 of my U.S. Pat. No. 4,240,092, implemented in the same chip as the memory array. The circuit may be programmed for various Vx voltages by a metal mask changer to select one out of several possible voltages including Vdd, Vcc, Vss, and a Vx generated from Vdd. The Vx generated from Vdd has a further advantage in that high transient voltages on the supply lines as may occur accidentally are isolated from the capacitor dielectrics. A voltage spike can destroy a memory device by breaking down a capacitor dielectric.

Although the invention has been described with reference to specific embodiments, this description is not meant to be construed in a limiting sense. Various modifications of the disclosed embodiments, as well as other embodiments of the invention, will become apparent to persons skilled in the art.

What is claimed is:

1. An N-channel random access memory cell having a field-effect transistor and a capacitor, the transistor having a source-to-drain path and a gate, comprising:
    (a) a body of P-type silicon having a major face;
    (b) an N+ type region defined in said major face and functioning as one end of said source-to-drain path of the transistor;
    (c) a capacitor region in said major face spaced from the N+ type region and functioning as a lower plate of said capacitor, the capacitor region being ion implanted with N-type conductivity determining impurity to lower the apparent threshold voltage of said capacitor region;
    (d) a thin dielectric layer overlying said capacitor region;
    (e) a first conductive layer overlying said dielectric layer and functioning as an upper plate of the capacitor;
    (f) an insulating coating over said first conductive layer;
    (g) a transistor channel region in said major face between said N+ type region and said capacitor region, the channel region functioning as the source-to-drain path of the transistor;
    (h) a thin gate insulator layer overlying said channel region,
    (i) a second conductive layer overlying the gate insulator layer and functioning as said gate of the transistor and said second conductive layer also partly overlying the first conductive layer but insulated therefrom by said insulating coating;
    (j) an insulating layer overlying the second conductive layer;
    (k) a conductive metal layer overlying the insulating layer and contacting the second conductive layer through an aperture in the insulating layer at a contact area;
    (l) means for supplying logic signals to said N+ type region of at least two voltage levels, one of the levels being at about a reference potential and the other being a positive voltage compared to the reference potential; and
    (m) means for applying a bias voltage to the first conductive layer, the bias voltage having a magnitude of about half said positive voltage.

2. A memory cell according to claim 1 wherein said capacitor region is ion implanted with phosphorus.

3. A memory device according to claim 1, wherein an MOS transistor source or drain region is defined at one edge of said channel region and connects to the ion implanted capacitor region.

4. In a memory cell of the type having a transistor at one face of a semiconductor body and a storage capacitor adjacent said transistor on said face for storing selected logic levels, the transistor having a channel region in series circuit with a semiconductor region of the capacitor, the capacitor having an upper plate above the semiconductor region, the improvement wherein said semiconductor region is ion-implanted to provide a threshold voltage substantially less than that exhibited by the channel region of the transistor, and means to apply a bias voltage of about half the value of the maximum of said logic levels to said upper plate.

5. In an MOS memory cell according to claim 4, the channel region being contiguous with said one edge of the semiconductor region.

6. In an MOS memory cell according to claim 4, a first conductive layer overlying a first thin oxide coating providing the gate of the transistor, and a second conductive layer overlying a second thin oxide coating providing the upper plate of the storage capacitor.

7. In an MOS memory cell according to claim 6, the first and second conductive layers being polycrystalline silicon and one partially overlying the other.

8. In an MOS memory cell according to claim 7 wherein the semiconductor region extends beyond the second conductive layer in the direction of the channel region.

9. A memory device comprising a plurality of memory cells, each memory cell formed at a face of a silicon body and having an insulated-gate field effect transistor and capacitance means, the transistor including a conductive gate and a source-to-drain path formed in said face, a gate insulator layer separating the conductive gate from the face, a heavily doped region at one end of the source-to-drain path in said face, the heavily doped region connected to an elongated sense line for application of logic-level voltages thereto, the capacitance means including a conductive plate and a dielectric thinner than said gate insulator insulating said conductive plate from said face, and further including a capacitor region in said face beneath said plate, said capacitor region being ion-implanted with impurity at a doping level less than that of said heavily-doped region. Said conductive plate being part of a wider conductor layer which forms the conductive plate of the capacitance means of a number of like cells along said face, said conductor strip being connected to a selected potential having a level in the range of zero to about half of said logic-level voltage, and elongated conductive means forming the gates of at least two memory cells and extending along the face.

10. A memory cell according to claim 9 wherein first and second conductive levels are included in the cell, with the second conductive level at least partially overlying the first conductive level but insulated therefrom, the first conductive level providing said conductive plate and said wider conductor layer, the second conductive level providing the conductive gate of the transistor, the other end of said source-to-drain path of the transistor being provided by an edge of said capacitor region, the elongated conductive means being defined by the second conductive level.

11. A memory cell according to claim 9, wherein the capacitor region is an implanted region having a low threshold voltage.

12. A memory cell according to claim 11, wherein the capacitor region is an inverted region and the selected potential is a voltage of substantially less than logic levels stored in the capacitance means in operation of the cell.

13. An array of memory cells formed in a face of a semiconductor body, each cell having an insulated-gate field-effect transistor and capacitance means;

the transistor of each cell including a conductive gate and including a source-to-drain path formed in said face, a gate insulator layer separating the conductive gate from the face, a heavily doped region as one end of the source-to-drain path in said face, the heavily doped region connected to an elongated sense line extending along said face, and elongated conductive means coupled to the conductive gate and extending along said face;

the capacitance means of each cell storing logic voltage levels of predetermined magnitude and including a semiconductor region and a conductive plate, the conductive plate being separated from said semiconductor region in said face by a dielectric thinner than said gate insulator, the semiconductor region being ion-implanted at a doping level less than that of said heavily-doped region, the conductive plate being part of a wider conductor layer which forms part of like capacitance means of a number of other ones of said memory cells along said face, said conductor layer being connected to a selected potential;

wherein said selected potential is in the range of zero to substantially less than the maximum of said logic voltage levels.

14. An array of memory cells according to claim 13 wherein first and second conductive levels are included in the array, the second conductive level at least partially overlying the first conductive level but insulated therefrom, the first conductive level providing said conductive plate and said wider conductor layer, the second conductive level providing said elongated conductive means and the gate of the transistor, the capacitance means including a capacitor region in said face beneath said plate, the other end of the source-to-drain path of the transistor being provided by an edge of the capacitor region.

15. An array of memory cells according to claim 13, wherein the capacitor region is an implanted region having a low threshold voltage.

16. A memory cell comprising:
an insulated gate field effect transistor having a source to drain path at a face of a semiconductor body and a gate on said face, the gate being insulated from the source-to-drain path by a gate insulator layer,
capacitor means at said face and coupled to said capacitor means having a grounded conductive plate above the face and an ion-implanted semiconductor region in said face, the conductive plate being insulated from said semiconductor region by a capacitor insulator layer, said gate insulator layer being substantially thicker than said capacitor insulator layer, said semiconductor region being coupled to said source-to-drain path;
wherein said ion-implanted semiconductor region beneath said conductive plate is doped at a level less than that of one end of said source-to-drain path, and exhibits threshold voltage lower than that exhibited by said source-to-drain path beneath said gate.

17. A cell according to claim 16 wherein said gate insulator layer and said capacitor insulator layer are both silicon oxide, and said body is silicon.

18. A cell according to claim 17 wherein said gate and said conductive plate are both polycrystalline silicon.

19. A cell according to claim 16 wherein said semiconductor region is ion-implanted with an impurity of type opposite the predominate impurity in said body.

20. A memory device including a plurality of memory cells each having a transistor including a gate insulator and a source-to-drain path, and a capacitor having a dielectric separating first and second plates at a face of a semiconductor body comprising:
- a first conductor overlying said gate insulator on said face to form a gate defining said source-to-drain path of said transistor in said face;
- a first doped region formed at one end of said source-to-drain path, said first doped region being coupled to a sense line for providing logic signals to said one end of said source-to-drain path;
- a second doped region connected to a second end of said source-to-drain path; and
- a second conductor overlying said dielectric to form said first plate and defomimg a capacitor region in said face including at least part of said second doped region to form said second plate, said dielectric having a thickness less than that of said gate insulator, said capacitor region being doped to a level that is less than that of said capacitor region being region, said first conductor at least partially overlying said second conductor;
- said second conductor connected to a selected voltage having a level less than the maximum potential applied for storage on said capacitor.

21. A memory device according to claim 20, wherein said capacitor region is an implanted region having a threshold voltage that is lower than that of said transistor.

22. A memory device according to claim 20, wherein said first doped region forms another end of a second source-to-drain path of at least one other memory cell formed at said face.

23. A memory cell according to claim 20, wherein said first and second conductors comprise polysilicon.

24. A memory device according to claim 20, wherein said first conductor defines an elongated conductor that forms the gate electrode of at least one other transistor formed at said face.

25. A memory device according to claim 20, wherein said second conductor comprises a layer extending along said face to form other plates for a number of like memory cells along said face.

26. A memory device according to claim 24, further comprising a third conductor connected to said first conductor for providing a control signal to said at least one other transistor.

27. A memory device according to claim 20, wherein said capacitor region is doped to the same doping level as said second doped region.

28. A memory device according to claim 20, wherein said first doped region forms the source of said transistor and said second doped region forms the drain of said transistor.

29. A memory device according to claim 20, wherein said capacitor region is an inverted region and said selected voltage is a voltage of less than the maximum voltage stored by said capacitor during operation of said memory cell.

30. A memory device according to claim 20, wherein said sense line comprises an elongated doped region formed in the face of said semiconductor body.

31. A memory device according to claim 20, further comprising a conductive strip coupled to said gate at a first location and coupled to at least a second gate of a second transistor at a second location, said conductive strip forming a control line for said gate and said second gate.

32. A memory device including a plurality of memory cells each having a transistor including a gate and a source-to-drain path, and a capacitor having a dielectric separating first and second plates at a face of a semiconductor body comprising:
- a first conductive layer forming a gate on said gate insulator overlying selected regions of said face and at least partially overlying the source-to-drain path of a first and second transistor;
- a doped region formed at one end of the source-to-drain path of said first and a third transistor;
- a second conductive layer forming said first plates over said dielectric and defining a plurality of capacitor regions in said face to form said second plates;
- said dielectric being thinner than said gate insulator, said capacitor regions doped to a level less than said first plurality of doped regions, and said first plates connected to a potential within the range of zero to less than the maximum potential applied for storage on said capacitors; and
- a third conductive layer connected to said first conductive layer.

33. A memory device according to claim 32, where in said capacitor regions are implanted regions having a threshold voltage that is lower than that of said transistor.

34. A memory device according to claim 32, wherein said first conductive layer at least partially overlies said second conductive layer.

35. A memory device according to claim 32, wherein said first and second conductive layers comprise polysilicon.

36. A memory device according to claim 32, wherein said first plurality of doped regions are each connected to an elongated sense line for providing logic signals to said plurality of memory cells.

37. A memory device according to claim 32, wherein said third conductive layer forms an elongated control line to provide an activating signal to said first and second transistors.

38. A memory device according to claim 9, wherein said elongated sense line comprises an elongated doped region formed in said face.

39. A memory device according to claim 9, wherein said elongated sense line is connected to at least one other heavily doped region in a like memory cell formed at said face.

40. A memory device including a plurality of memory cells each having a transistor including a gate insulator and a source-to-drain path and a capacitor having a dielectric separating first and second plates at a face of a semiconductor body comprising:
- a first conductor overlying said gate insulator on said face to form a gate defining said source-to-drain path of said transistor in said face;
- a first doped region formed at one end of said source-to-drain path, said first doped region being coupled to a sense line for providing logic signals to said one end of said source-to-drain path;
- a second doped region formed at a second end of said source-to-drain path; and
- a second conductor overlying said dielectric to form said first plate and defining a capacitor region in said face including at least part of said second doped region to form said second plate, said dielectric having a thickness less than that of said gate insulator, said capacitor region being doped to a level that is less than that of said first doped region and said second conductor connected to a voltage having a level about half of the level of said logic signals.

41. A memory device according to claim 40, wherein said capacitor region is an implanted region having a threshold voltage that is lower than that of said field effect transistor.

42. A memory device according to claim 40, wherein said first doped region forms another end of a second source-to-drain path of at least one other memory cell formed at said face.

43. A memory device according to claim 40, wherein said first and second conductors comprise polysilicon.

44. A memory device according to claim 40, wherein said first conductor defines an elongated conductor that forms the gate electrode of at least one other transistor formed at said face.

45. A memory device according to claim 40, wherein said second conductor comprises a layer extending along said face and including other conductive plates for a number of like memory cells.

46. A memory device according to claim 44, further comprising a third conductor connected to said first conductor for providing a control signal to said at least one other transistor.

47. A memory device according to claim 40, wherein said capacitor region is doped to the same doping level as said second doped region.

48. A memory device according to claim 40, wherein said first doped region forms the source of said transistor and said second doped region forms the drain of said transistor.

49. A memory device according to claim 40, wherein said sense line comprises an elongate doped region formed in the face of said semiconductor body.

50. A memory device according to claim 40, further comprising a conductive strip coupled to said gate at a first location and coupled to at least a second gate of a second transistor at a second location, said conductive strip forming a control line for said gate and said second gate.

51. A memory device according to claim 40, wherein said first conductor at least partially overlies said second conductor.

* * * * *

UNITED STATES PATENT AND TRADEMARK OFFICE
CERTIFICATE OF CORRECTION

PATENT NO. : 4,827,448

DATED : May 2, 1989

INVENTOR(S) : Chang-Kiang Kuo

It is certified that error appears in the above-identified patent and that said Letters Patent is hereby corrected as shown below:

Col. 1, line 43, replace "InstrumentS" with --Instruments--;
       line 48, replace "s." with --S.--;
       line 54, replace "645,171." with --645,171,--;

line 67, replace "seem" with --seen--;
Col. 3, line 6, replace "patent Aaplication" with --Patent Application--;
       line 23, replace "is is" with --is--;
       line 47, replace "5" with --15--;
       line 50, replace "4a-4b" with --4a-4g--;
       line 59, replace "an" with --a--;
Col. 4, line 57, replace "an" with --a--;
Col. 5, line 5, replace "an" with --a--;
       line 8, replace "an" with --a--;
       line 13, replace "an" with --a--;
       line 16, replace "an" with --a--;
       line 35, replace "region. Said" with --region, said--;
       line 39, delete "strip" and insert --layer--;
Col. 6, line 40, replace "source to drain" with --source-to-drain--;
Col. 7, line 14, delete "defomimg" and insert --defining--;
       lines 19-20, delete "capacitor region being region," and insert --first doped region,--;
Col. 8, line 18, delete "first plurality of";
       line 18, replace "regions," with --region--; and
       line 24, replace "where in" with --wherein--.

UNITED STATES PATENT AND TRADEMARK OFFICE
CERTIFICATE OF CORRECTION

PATENT NO. : 4,827,448

DATED : May 2, 1989

INVENTOR(S) : Chang-Kiang Kuo

It is certified that error appears in the above-identified patent and that said Letters Patent is hereby corrected as shown below:

Col. 8, line 6, replace the second occurring "a" with —said—; and
line 6, replace "said" with —a—.

Signed and Sealed this

Eighth Day of May, 1990

*Attest:*

HARRY F. MANBECK, JR.

*Attesting Officer*  *Commissioner of Patents and Trademarks*